AUTOMATIC FREQUENCY AND PHASE CONTROL

Filed Oct. 9, 1958 2 Sheets-Sheet 1

INVENTOR.
MICHAEL COOPERMAN
BY
W. H. Sprague
ATTORNEY

Feb. 5, 1963

M. COOPERMAN 3,076,943

AUTOMATIC FREQUENCY AND PHASE CONTROL

Filed Oct. 9, 1958

2 Sheets-Sheet 2

INVENTOR.
MICHAEL COOPERMAN
BY
W. H. Sprague
ATTORNEY

United States Patent Office 3,076,943

Patented Feb. 5, 1963

3,076,943

AUTOMATIC FREQUENCY AND PHASE CONTROL

Michael Cooperman, Haddon Township, Camden County, N.J., assignor to Radio Corporation of America, a corporation of Delaware Filed Oct. 9, 1958, Ser. No. 766,233
12 Claims. (Cl. 331—4)

This invention relates to automatic tuning circuits, particularly to such circuits using reactance devices that exhibit a memory function with respect to their reactance values.

Automatic tuning circuits, in present practice, generally control the frequency or phase, or both, of an oscillator circuit in accordance with the deviation of the oscillator from the frequency or phase desired. Error detecting circuits for detecting the shift of oscillator frequency or phase provide a control signal that is indicative of the direction of the mistuning of the oscillator. To some extent the error detector may also provide an indication of the amount of mistuning. These automatic frequency control circuits are also generally operated in the form of a feedback loop, that is, the frequency of the oscillator affects the output of the error detector and the error detector in turn affects the frequency of the oscillator. This loop action may give rise to problems of loop gain and noise immunity in many types of commercial signal receivers, such as television receivers.

Also, automatic frequency control of an oscillator in a receiver using present day techniques is dependent upon a signal being present in the receiver. If no signal is present, the oscillator is uncontrolled. Under such circumstances, the oscillator frequency may be returned to some quiescent value in the absence of a received signal which will allow the automatic frequency control circuit to operate in the proper manner when a signal is later received. It is thus desirable to have a reactance device which may be set to a particular reactance value and which will remain at this value even after the setting condition is removed from the device.

In the last few years great strides have been made in the development and use of ferromagnetic devices. Many of these devices exhibit characteristics such that the inductance of a winding associated with one of these devices may be varied over a considerable range by a controllable change in the permeability of the device. Many of these devices exhibit a memory characteristic, that is the permeability of the device may be set by a signal and the device will retain the permeability setting even after the signal has been removed. One such device, the transfluxor, is described in an article appearing in the Proceedings of the IRE for March, 1956, page 321 et seq., entitled, "The Transfluxor" by Rajchman and Lo.

It is, therefore, an object of this invention to provide an improved automatic frequency or phase control circuit for an oscillator.

It is a further object of this invention to provide an improved oscillator automatic frequency or phase control circuit eliminating direct feedback control of the oscillator phase or frequency.

It is yet a further object of this invention to provide an improved automatic phase or frequency control circuit for an oscillator utilizing a reactance device having a memory function in the control circuit.

In accordance with the invention, an error correcting circuit for an oscillator, which has tuning elements, includes a reactance means connected to the tuning elements of the oscillator. The reactance means is of a character such that its reactance value may be set to any value within a range of values. If the oscillator becomes mistuned, the reactance value of the reactance means is randomly varied until the correct oscillator frequency is selected, and is set to this value.

In accordance with an illustrative embodiment of the invention, the frequency or phase of an oscillator circuit is controlled by providing an error detector circuit, the function of which is to determine only if the oscillator is in phase or frequency synchronism. A control signal from the detector circuit determines merely the condition of a switching circuit connected to apply an auxiliary signal to a reactance control device of the type which may be set to a given value and which remains at this value even after the setting signal is removed. The reactance device is connected with the frequency determining circuit of the oscillator to control its frequency or phase. If the oscillator should drift from its prescribed frequency or phase condition, the detector circuit senses the drift and closes the switching circuit to apply the auxiliary signal to the reactance device. The auxiliary signal is arranged to sweep the reactance value of the reactance device through many different values and at the point where the reactance value produces through its associated circuitry the correct oscillator frequency, the detector circuit control signal is reduced to a minimum and the switching circuit is opened, preventing further application of the auxiliary signal to the reactance device. The reactance value of the reactance device remains at the set value and the oscillator signal is thus held at the correct frequency or phase condition.

The invention, however, may be better understood when the following description is read in connection with the accompanying drawings, in which.

Figure 1:
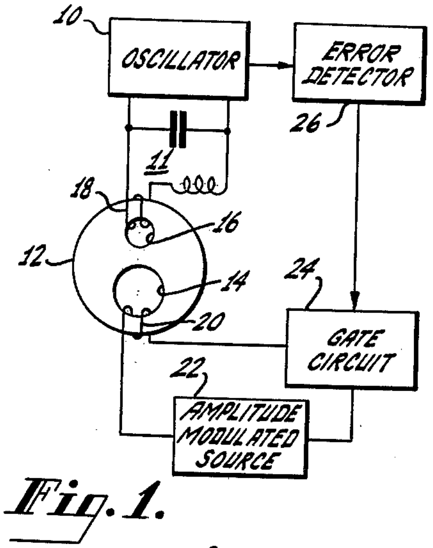
FIGURE 1 is a schematic circuit diagram of an oscillator automatic tuning control circuit in accordance with the invention.
Figures 2, 4:
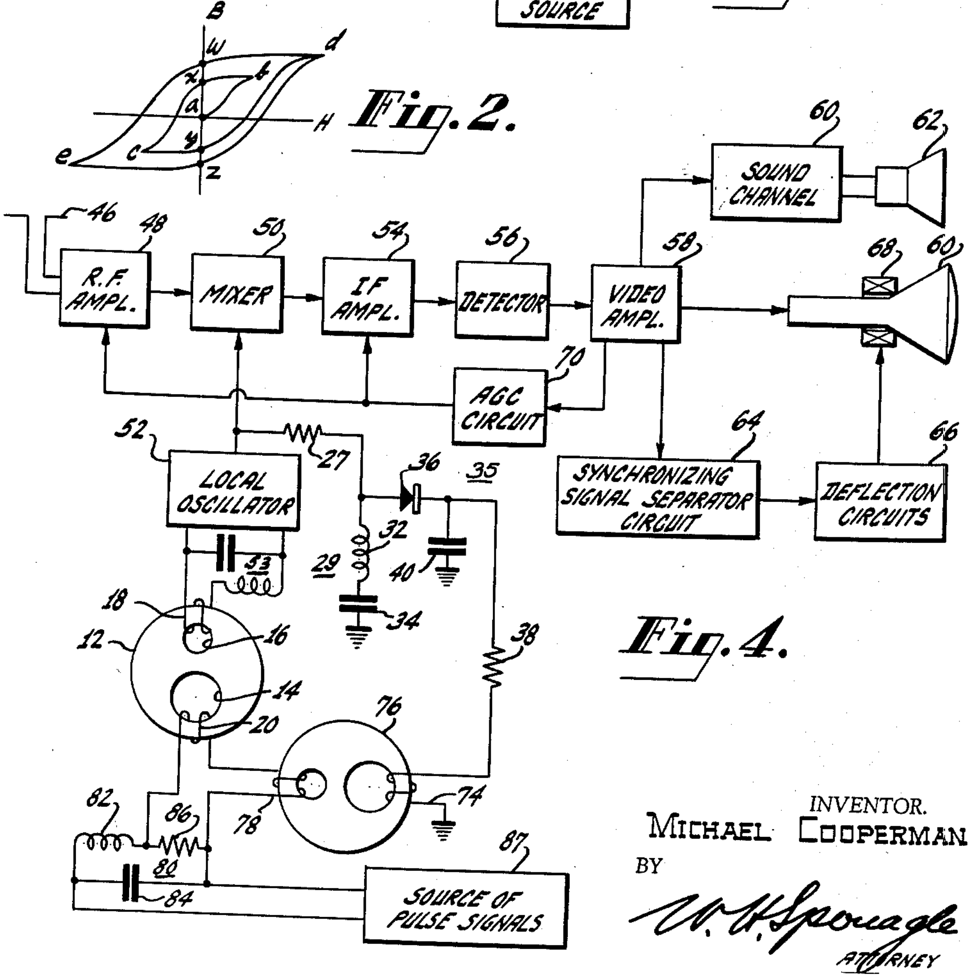
FIGURE 2 is a graph showing curves illustrating certain operating characteristics of the circuit of FIGURE 1.
FIGURE 4 is a schematic circuit diagram of a television receiver having an automatic frequency control circuit for the heterodyne oscillator of the receiver, illustrating another embodiment of the invention.

Referring now to the drawings and particularly to FIGURES 1 and 2, an oscillator 10, which may be of any conventional type, has an automatic tuning circuit in accordance with the invention. A reactance device which exhibits a memory characteristic, in this case a transfluxor device 12, is connected to the tuning or frequency-determining circuit 11 of the oscillator 10, and includes a control aperture 14 and an output aperture 16. An output winding 18 in the output aperture 16 is included in the frequency determining circuit 11 of the oscillator 10. The control aperture 14 has a control winding 20 therein which is connected to an auxiliary source of signal, here illustrated as a source of amplitude modulated (AM) signal 22, through a gate or switching circuit 24. With the gate circuit 24 open no AM signal is applied to the control winding 20, but with the gate circuit 24 closed the AM signal is connected directly to the control winding 20.

The oscillator signal is applied to an error detector 26 whose output signal is applied to the gate circuit 24. The function of the error detector 26 is merely to provide an indication of whether the oscillator signal is at the correct tuning and to open or close the gate circuit 24 accordingly. The simplest way of accomplishing this result is to provide that the error detector 26 has no control signal output at the correct oscillator tuning, but has an output signal if the oscillator 10 is mistuned.

If the oscillator signal is correctly tuned, no control signal output is provided by the error detector 26 and the gate circuit 24 is open. No AM signal is applied to the control winding 20 of the transfluxor 12. However, if the oscillator 10 should become mistuned in phase or frequency, a control signal is available from the error detector 26 which serves to close the gate circuit 24 to allow the source of AM signal 22 to be applied to the control winding 20 of the transfluxor device 12.

The action thus provided is best illustrated in FIGURE 2, which shows the hysteresis loop characteristics of the transfluxor device 12, and is a plot of the magnetizing force (H) against the magnetic flux density (B). Assume for the moment that the transfluxor device 12 has no flux therein. Its condition will then be illustrated by the point *a* on the B—H curve of the device. As the AM signal is applied to the control winding 14 the magnetizing force H changes in a cyclic manner to sweep the transfluxor 12 through many permeability conditions. The inductance or reactive value of the output winding 18 is determined by the permeability of the transfluxor 17. Thus the flux condition of the transfluxor 12 begins at point *a*, is driven to point *b*, then to points *c*, *d*, and *e* in succession. The instantaneous amplitude of the AM signal determines the value of the magnetizing force (H), and thus an amplitude modulated signal will sweep the magnetizing force through many different values. The number of permeability variations shown in FIGURE 2 is merely illustrative, and the number and degree of variations is determined by the modulation of the AM source. The permeability of the transfluxor 12 is swept across its entire range. At the point, however, when the varying permeability or flux density B of the transfluxor at zero magnetizing force H (such as points *w*, *x*, *y*, or *z*) produces a reactive value in the inductance of the output winding 18 of the correct value to give the required tuning of the oscillator 10, the control signal from the error detector 26 disappears, and the gate circuit 24 is opened, disconnecting the AM source 22 from the control winding 20 of the transfluxor 12. Sweeping of the transfluxor 12 is thus stopped and the inductance, and hence the reactive value, of the output winding 18 remains at that value last set by the AM source 22. The transfluxor 12 "remembers" the permeability to which it was set and remains at this value until it is again swept by a signal from the AM source 22.

It will be noted that there is no continuous interaction between the error detector 26 and the oscillator 10 during the time when the oscillator tuning is being changed, that is, the error detector output does not shift the oscillator tuning, which in turn again shifts the error detector output to again shift the oscillator tuning; but rather the error detector 26 merely provides a signal to close a switch 24 to apply an AM source 22 to sweep the permeability transfluxor 12. The correct oscillator tuning is thus randomly selected by the circuit. The entire function of the error detector 26 is to allow such random selection to occur. It will also be noted that if the oscillator signal should be cut off from the error detector 26 that the oscillator 10 will continue to oscillate at the tuning last set by the sweeping of the transfluxor 12.

Figure 3:
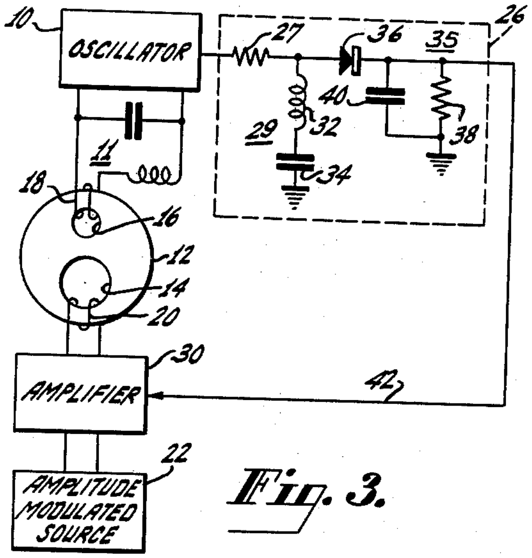
FIGURE 3 is a schematic circuit diagram of an oscillator automatic frequency control circuit, illustrating another embodiment of the invention.

Referring now to FIGURE 3, the oscillator circuit 10 again includes a transfluxor 12 associated with its frequency determining circuit 11. The output winding 18 in the output aperture 16 is again included in the frequency-determining or tuning circuit 11 of the oscillator 10; and the control winding 20 is again connected to the control aperture 14. In this embodiment, however, the control winding 20 is connected to an amplifier circuit 30 which in turn is connected to the AM source 22. A portion of the output signal of the oscillator 10 is fed through a resistor 27 across a series resonant circuit 29, comprising an inductor 32 and a capacitor 34, tuned to the desired operating frequency for the oscillator 10. Connected across the series resonant circuit 29 is a rectifier circuit 35, including a diode 36 in series with a resistor-capacitor network, comprising a resistor 38 and a capacitor 40, connected in parallel. Any voltage that may appear across the resistor 38 is connected by the lead 42 to the amplifier 30.

In operation, if the oscillator 10 is at the prescribed frequency, a minimum voltage is developed across the series resonant circuit 29, since the series resonant circuit 29 is at its minimum impedance and the resistance of the resistor 27 is constant. Little or no signal is thus available for rectification by the rectifier circuit 35 and little or no voltage is thus developed across the resistor 38. The bias of the amplifier 30 is controlled by the voltage available across the resistor 38 and the amplifier is cut off at minimum or zero voltage across the resistor 38. Thus, the amplifier 30 serves as a gate circuit in the manner described in the circuit of FIGURE 1.

If the oscillator should drift from its prescribed frequency, the impedance of the series resonant circuit 29 increases, causing a larger voltage to be developed thereacross and providing a signal to the rectifier 36. A direct control signal voltage is thus developed across the resistor 38. The control voltage is coupled by the lead 42 to the amplifier 30 which is biased to conduct thereby. The output of AM source 22 is then applied through the amplifier 30 to the control winding 20 of the transfluxor 12. The transfluxor 12 has its permeability swept in the manner described with reference to FIGURE 1. As the reactance of the output winding 18 develops an oscillator frequency equal to that which the series resonant circuit 29 is tuned, no signal is available for rectification by the diode 36 and the control voltage on lead 42 vanishes, biasing off the amplifier 30. No signal then can be applied from the AM source 22 to the control winding 20, and the permeability of the transfluxor 12 remains at the last setting.

It will be noted that the circuit described in FIGURE 3 includes an amplifier 30 and an AM source 22. The circuit of FIGURE 4 illustrates a manner of providing their functions, that is, a gating circuit and an AM source, in a television receiver in a much simpler manner.

Referring now to FIGURE 4, there is illustrated a television receiver which includes an antenna 46 for intercepting and supplying a television signal, including a video carrier and sound carrier, spaced 4.5 mcs. apart in present practice, to a radio frequency (R.F.) amplifier 48. The carriers are conveyed from the R.F. amplifier 48 to a mixer circuit 50 where they are heterodyned with a signal from a local oscillator 52 to provide video and sound intermediate frequency carriers in the conventional manner. The intermediate frequency carriers are amplified in an intermediate frequency (I.F.) amplifier 54 and applied to a detector circuit 56. In the detector circuit 56 the video intermediate frequency carrier is detected and the video and sound intermediate frequency carriers are heterodyned in the conventional manner to provide an intercarrier sound signal of 4.5 mcs. The detected video signal and the intercarrier sound signal are applied to a video amplifier 58 which further amplifies and applies the video signal to a kinescope 60. The intercarrier sound signal is removed from the video amplifier 58 and applied to a sound processing circuit 60, where the intercarrier sound signal is amplified, detected, and applied to a loudspeaker device 62. Also, in a conventional manner, the synchronizing components of the video signal are separated therefrom by a synchronizing signal separating circuit 64 and applied to the horizontal and vertical deflection circuits 66 of the television receiver, which produce proper currents and voltages to apply to the deflection windings 68 of the kinescope 60 to properly deflect its electron beam. Finally, from the video amplifier 58 may be derived an automatic gain control signal by an automatic gain control circuit 70, which signal is applied to the R.F. and I.F. amplifiers 48 and 54 to control their gains. The television receiver thus far described is entirely conventional and forms no part of the present invention.

An automatic frequency control circuit for the local oscillator 52, in accordance with the invention, includes the resistor 27, the series resonant circuit 29 and rectifier circuit 35 connected to the signal output circuit of the oscillator 52. These circuits are identical to those described in FIGURE 3 except that the rectifier load resistor 38 is returned to ground in a slightly different manner, as will be more fully explained hereinafter. The oscillator circuit 52 also includes as a reactance device a transfluxor 12 together with its control and output apertures 14 and 16 and control and output windings 18 and 20, which are connected to the frequency determining circuit 53 of the oscillator 52 in a manner identical to that described in FIGURE 3. The control signal voltage that may be available across the resistor 38 of the detector circuit 35 is applied to a gate control winding 74 on a second transfluxor 76 by connecting the resistor 38 and the gate control winding 74 in series between the rectifier 36 and ground for the system. A gate output winding 78 on the second transfluxor 76 is connected in series with the control winding 20 of the transfluxor 12.

In order to provide an amplitude modulated signal, similar to that described with reference to the AM source 22 of FIGURES 1 or 3, a parallel resonant circuit 80, including an inductor 82 connected in parallel with a capacitor 84, is provided. A resistor 86 is connected in series with the inductor 82 and the control winding 20 of the transfluxor 12 is connected across this resistor through the gate output winding 78 of the second transfluxor 76. In order to provide the AM signal, it is only necessary to apply a pulse signal from a source of pulse signals 87 across the parallel resonant circuit 80. Such a pulse signal is available at a number of places in a television receiver, such as, in the horizontal and vertical deflection circuits, as is known by those skilled in the art. The pulse signal applied to the resonant circuit 80 will cause the circuit to ring and provide damped oscillations across the circuit. These damped oscillations are suitable as for the AM source.

The operation of the circuit of FIGURE 4 is almost identical to that of FIGURE 3, with the exception of the pulsed operation. If the frequency of the oscillator 52 is correct, no control voltage will be developed across the resistor 38 of the rectifier circuit 35, and no control current will be applied to the gate control winding 74 of the second transfluxor 76. The inductance of the gate output winding 78 is then a high impedance and little of the ringing signal from the parallel resonant circuit 80 will be applied to the control winding 20 of the transfluxor 12. However, if the oscillator 52 should drift from its prescribed frequency, a control voltage will be developed across the resistor 38 and provide current flow through the gate control winding 74 of the second transfluxor 76. This action decreases the impedance of the gate output winding 78 and allows the ringing signal of the resonant circuit 80 to be applied to the control winding 20 of the transfluxor 12. This ringing signal will sweep the permeability of the transfluxor 12, as described with reference to FIGURE 1, until the proper oscillator tuning is reached, at which time the control voltage from the rectifier 35 disappears preventing current flow in the gate control winding 74 and causing the gate output winding 78 of the second transfluxor 76 to become a high impedance and stop the sweeping action.

The sweeping action in this embodiment can only occur when a pulse is applied to the resonant circuit 80, so that the frequency of the oscillator 52 may be conveniently changed during the horizontal or vertical blanking interval of the receiver. The vertical rate has proved satisfactory, even though it is at a relatively low frequency.

It will be noted that the embodiments of the invention that have so far been described have illustrated control of the oscillator from the oscillator signal directly, without the interposition of other elements such as intermediate frequency amplifiers. Also, all of the previously described embodiments have included a separate source of amplitude modulated signal of one sort or another. The circuit shown in FIGURE 5, to which reference is now made, illustrates that the invention is applicable to the control of a local oscillator in a superheterodyne receiver using the intermediate frequency of a receiver and that an auxiliary source of amplitude modulated signal is not required. The receiver illustrated in FIGURE 5 includes an antenna 90 to intercept and apply a received signal to a radio frequency amplifier 92, which amplifies the signal and applies it to a mixer 94. In the mixer 94 the signal is heterodyned with an oscillator signal from a local oscillator 96 to develop an intermediate frequency signal, in the usual manner, which is applied to an intermediate frequency amplifier 98. The signal, after processing by the intermediate frequency amplifier 98, is applied to any desired utilization circuit 100, which may, in a typical case, consist of conventional television receiver circuits, such as previously described with reference to FIGURE 4.

In accordance with the invention, an automatic frequency control circuit for the local oscillator 96 includes an error detector 102 connected to receive a portion of the output signal of the intermediate frequency amplifier 98. The error detector 102 may be of the type shown in FIGURES 3 and 4, that is, a series resonant circuit feeding a rectifier circuit. The output of the detector 102 is fed through a lowpass filter 104, to remove any spurious high frequency signals that may be present, to one terminal of a storage capacitor 106. The other terminal of the storage capacitor 106 is connected to ground or a point of reference potential for the receiver. The ungrounded terminal of the storage capacitor 106 is connected to one of the collector-emitter electrodes 108 of a bidirectional transistor 110. The other collector-emitter electrode 112 of the transistor 110 is connected to the control winding 20 of a reactance transfluxor 12. The transfluxor 12 may be identical to those shown and described previously. The other end of the control winding 20 is connected to ground. As has been previously described with respect to FIGURE 4, the output winding 18 of the reactance transfluxor 12 is connected in the frequency determining or tuning circuit 109 of the oscillator 96.

The bidirectional transistor 110 may be of the type disclosed in a patent issued to Sziklai on December 27, 1955, Patent No. 2,728,857. Briefly, such a bidirectional transistor is able to conduct current in both directions, the direction of current flow being determined by the bias on the electrodes. When the transistor is conductive, or in the closed state, it presents a low impedance between its pair of collector-emitter electrodes; but when it is non-conductive, or in the open state, it presents a high impedance. In order to insure that the transistor 110 conducts only during the required times, it is normally biased to the non-conducting or open state by connecting the base electrode 113 thereof to the junction point of a voltage divider, comprising a pair of serially connected resistors 114 and 116 connected between ground and a source of potential positive with respect to ground. In order to render the transistor 110 conductive or in the closed state at the proper time, since pulse operation as described in connection with FIGURE 4 is necessary, a gating pulse signal from a source of pulse signals 87 is applied to the base electrode 113 of the transistor 110 through a coupling capacitor 120.

In operation, if the local oscillator 96 is at the proper frequency to produce the required I.F. signal the detector circuit 102 produces no output signal. In a television receiver, either the video or sound I.F. frequency may be used. If, however, the oscillator is at such a frequency that an incorrect I.F. signal is being produced, a control signal voltage is generated by the detector 102 and applied through the lowpass filter 104 to the storage capacitor 106. This action charges the storage capacitor 106 with the control voltage during the interval when the transistor 110 is biased to a non-conductive state. When a pulse is applied to the base electrode 113 of the transistor 110, the transistor 110 becomes conductive and the charged storage capacitor 106 will be connected directly therethrough to the control winding 20 of the transfluxor 12. This will provide a circuit containing an inductance and a charge capacitor. The energy will be transferred alternately from the capacitor 106 to the control winding 20 and back to the capacitor 106, and a ringing signal will thus be developed across the control winding 20. The ringing signal will be gradually damped, and is, in effect, a modulated signal applied to the control winding 20; and, as has been previously explained, will sweep the permeability characteristics of the transfluxor 12 in order to change the reactance of the output winding 18 to reduce the oscillator frequency error to zero. No error signal will then be developed by the detector 102 and the action is stopped. The gating or pulse signal is applied periodically to the transistor 110 in order to condition the circuit for automatic frequency control action, if the detector 102 produces an error signal. Such pulse signals are readily available in television receivers and could easily be supplied by a single multivibrator in receivers where pulse signals are not normally available.

Figures 5, 6, 7:
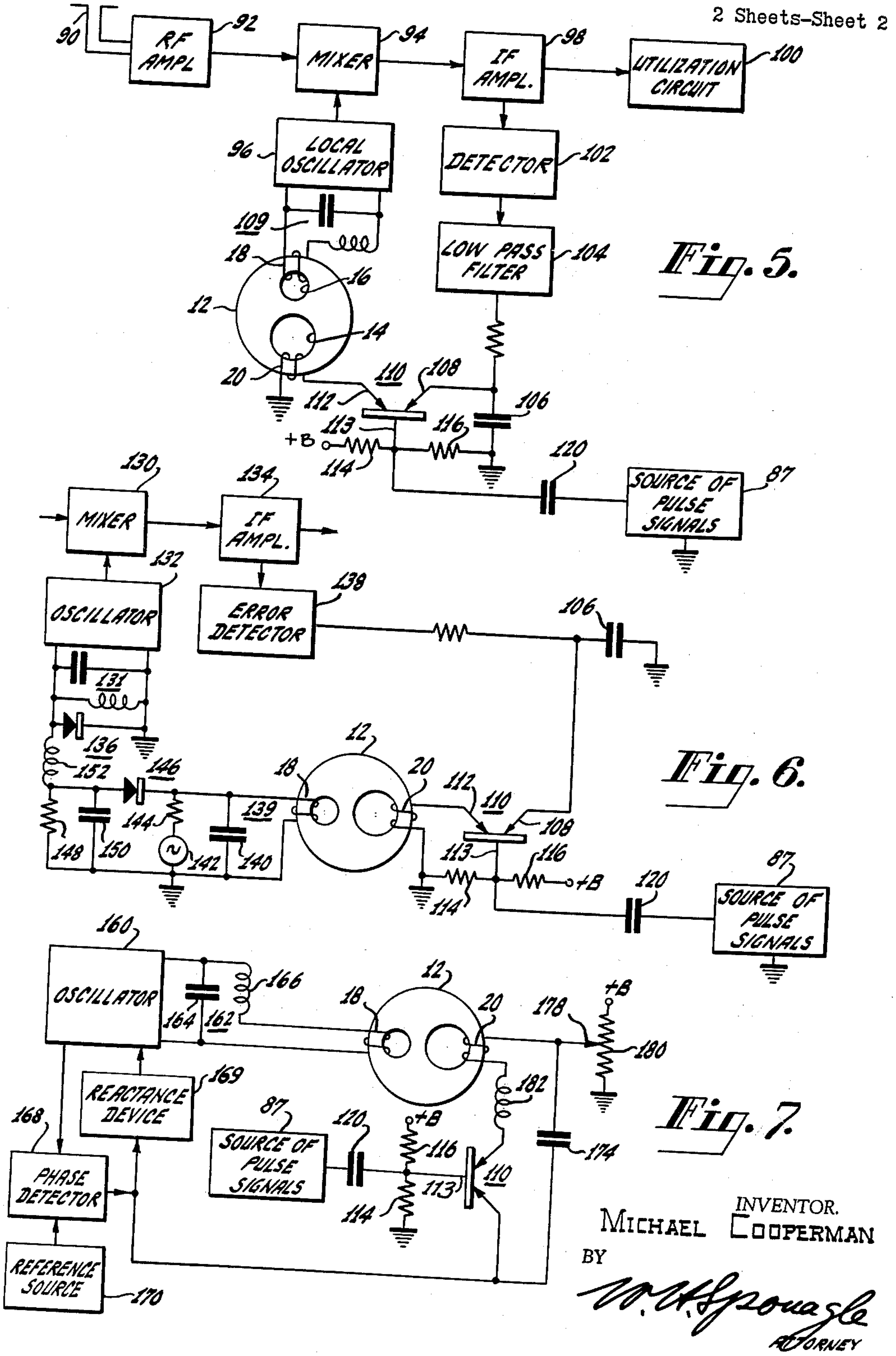
FIGURE 5 is a schematic circuit diagram of a signal receiver having an automatic frequency control circuit in accordance with the invention.
FIGURE 6 is a schematic circuit diagram of a portion of a signal receiver having an automatic frequency control circuit for the local oscillator in accordance with another embodiment of the invention.
FIGURE 7 is a schematic diagram of an oscillator automatic phase control circuit, illustrating yet another embodiment of the invention.

In some instances it may be undesirable or impossible to control the frequency of an oscillator circuit directly from the inductance of a winding associated with the transfluxor 12. An instance of this situation would be if the oscillator were operating at a frequency above that at which transfluxor operation is sufficient or even feasible. The circuit shown in FIGURE 6 illustrates how the invention may be used to provide a voltage variation and memory instead of an inductance variation and memory. The circuit here illustrated is a portion of a superheterodyne radio receiver and includes a mixer circuit 130 together with a local oscillator 132 and an intermediate frequency amplifier 134 which is supplied with signal from the mixer circuit 130. The remainder of the receiver has not been illustrated and may be a conventional receiver circuit.

In order to maintain the oscillator frequency at the correct value, there is provided a reverse biased reactance diode 136 which is connected across the frequency determining or tuning circuit 131 of the oscillator 132, in a conventional manner. Variation of the reverse bias across the reactance diode 136 produces a variable capacitance thereacross which varies the tuning of the oscillator 132. In order to provide a control voltage for the reactance diode 136, signals appearing in the I.F. amplifier 134 are applied to an error detector 138. The error detector may be similar to those shown in FIGURE 4 of the drawing. The output of the error detector 138 is applied to a storage capacitor 106 and the storage capacitor is connected to a bidirectional transistor 110 in the same manner as shown in FIGURE 5, that is, to a first collector-emitter electrode 108. The second collector-emitter electrode 112 of the transistor 110 is connected to the control winding 20 of a transfluxor 12 and the other end of the control winding 20 is connected to ground for the system. The transistor 110 is controlled in the same manner as described in FIGURE 5, with the base electrode 113 being biased to render the transistor 110 normally non-conductive by a voltage divider. Again, as in FIGURE 5, a gating or pulse signal, which periodically renders the transistor 110 conductive, is supplied from a source of pulse signals 87 through a coupling capacitor 120 to the base electrode 113 of the transistor 110.

The output winding 18 of the transfluxor 12 is the inductive portion of a parallel resonant circuit 139, which comprises the output winding 18 and a capacitor 140 connected thereacross. A source of alternating signal 142 is connected through a resistor 144 across the parallel resonant circuit 139. The alternating signal that is developed across the parallel resonant circuit 139 is rectified by a diode 146 and developed across a resistor-capacitor network, comprising a resistor 148 and a capacitor 150 connected thereacross. The direct voltage developed across the resistor 148 is applied through a choke coil 152 to the diode 136 to control the reverse bias and hence the capacitance thereof.

If the frequency of the oscillator 132 is such as to produce the correct intermediate frequency, the error detector 138 produces no control signal and the voltage stored in the capacitor 106 is zero. However, if the oscillator frequency should drift from its correct value, the error detector 138 will be driven by an incorrect intermediate frequency and will produce an output signal to charge the storage capacitor 106. As a pulse signal is periodically applied to close the transistor 110, the storage capacitor 106 will discharge through the control winding 20 to provide a ringing signal and to vary the permeability of the transfluxor 12. As so far described, this action is the same as that shown and described in the FIGURE 5. In FIGURE 5 the inductance of the output winding 18 of the transfluxor 12 was used to directly control the frequency of the oscillator.

In this circuit, however, the output winding 18 is a portion of a parallel resonant circuit 139, resonant to a frequency such that the frequency of the alternating signal source 142 normally lies on the slope of the resonance characteristic of the parallel resonant circuit 139. The normal voltage thus developed across the parallel resonant circuit is rectified by the diode 146 and applied to the diode 136 as the normal reverse bias therefor. However, if the frequency of the oscillator 132 is incorrect, the tuning of the parallel resonant circuit will be randomly changed by the discharge of the capacitor through the control winding 20 to change the inductance of the output winding 18. As a ringing voltage appears across the control winding 20 the permeability of the transfluxor 12 is swept to provide a varying impedance across the parallel resonant circuit 139 at the auxiliary source frequency. This produces a varying voltage across the parallel resonant circuit, which produces through the rectifier 146 a varying bias on the reactance diode 136. The oscillator frequency is thus varied, and at the point where it is at its correct value, the error detector 138 produces no signal and the control winding 20 of the transfluxor 12 is no longer energized at each conduction of the transistor 110. The permeability of the transfluxor 12 thus remains at the setting which gives the correct operating bias for the reactance diode 136 and produces the correct oscillator frequency. At the correct frequency the inductance of the winding 18 is not varied by the circuit, and the tuning of the parallel resonant circuit 139 is not being varied. Since the tuning of the parallel resonant circuit 139 is not now being varied, the alternating voltage applied to the diode 146 is not varied, and the direct voltage applied to the reactance diode 136 is thus held constant. The transfluxor 12 may thus be used to control oscillator frequencies which are far beyond the range within which it may be used directly, since the frequency of the alternating signal source 142 may be a frequency within the operating range of the transfluxor 12.

Referring now to FIGURE 7, there is illustrated an oscillator circuit whose phase may be controlled with respect to a reference signal in accordance with another aspect of the invention. The oscillator 160 includes a frequency determining circuit 162, having a capacitor 164 and an inductor 166 connected in parallel. The output winding 18 of a frequency control transfluxor 12 is connected in series with the inductor 166. Thus, the oscillator frequency is determined by the values of the capacitor 164, the inductor 166, and the output winding 18 of the transfluxor 12. In order to control the phase of the oscillator 160 in accordance with a reference signal, a portion of the oscillator output is applied to a phase detector 168, which also has a source of reference signal 170 applied thereto. If the oscillator signal and the reference signal are in phase, a normal output voltage is derived from the phase detector 168 and applied to a reactance device 169 and to one side of a capacitor 174. The other side of the capacitor 174 is connected to the slider 178 of a potentiometer 180, which is connected between a source of positive potential B+ and ground for the system. A voltage is set on the potentiometer 180 that is equal to the normal output voltage at the phase detector 168, so that when the oscillator 160 is properly phased no voltage is developed across the capacitor 174. Connected across the capacitor 174 is the series combination of the control winding 20 of the transfluxor 12, a second inductor 182 and a bidirectional switch transistor 110. The bidirectional transistor 110, together with a source of pulse signals 87, is connected and operated in the same manner as has been previously described in connection with FIGURES 5 and 6.

In operation, the correct phase between the oscillator signal and the reference signal produces no change in oscillator tuning by the reactance device 169 and no charging of the capacitor 174. If, however, the oscillator signal and the reference signal are not in the proper phase relationship, an output voltage other than normal will be provided by the phase detector 168. The reactance device 169 driven by the signal from the phase detector 168 maintains the oscillator 160 in instantaneous synchronism with the reference signal. The oscillator signal, however, may synchronize to an improper phase and the memory loop including the transfluxor 12 serves to correct for steady phase mistuning. The capacitor 174 will thus have, during oscillator mistuning, a voltage thereacross and will charge during the time that the transistor 110 is turned off. When a pulse signal is applied to the base electrode 113 of the transistor 110, it will be turned on, or changed to the closed state, and the capacitor 174 will discharge through the control winding 20 of the transfluxor 12 and the second inductor 182, which provides sufficient inductance in the circuit to generate a ringing signal. A ringing signal will thus appear across the control winding 20 of the transfluxor 12 and sweep the permeability of the transfluxor 12 in the manner described in connection with FIGURE 1. The oscillator frequency is continually shifted in this manner until the phase detector output is normal and does not charge the capacitor 174 between pulse signals. The oscillator is thus kept properly synchronized.

Having thus described the invention, what is claimed is:

1. An error correcting circuit for an oscillator having tuning elements, comprising in combination, a reactance device having a reactance value which may be set to any value within a range of values and connected with said tuning elements to control the tuning of said oscillator, error detecting means responsive to the frequency of said oscillator for providing a control signal when said oscillator is mistuned, and means responsive to said control signal for varying the reactance value of said device at random to select and set the correct tuning for said oscillator.

2. An error detecting circuit as defined in claim 1 wherein said error detecting means includes a series resonant circuit connected to said oscillator to provide a minimum signal thereacross when said oscillator is properly tuned, and rectifier means connected to said series resonant circuit for rectifying the signal across said series resonant circuit to provide a control signal when said oscillator is mistuned.

3. An error correcting circuit for an oscillator having tuning elements comprising in combination, a reactance device having a reactance value which may be set to any value within a range of values and connected with said tuning elements to control the tuning of said oscillator, means providing an auxiliary signal, error detecting means responsive to said oscillator frequency for providing a control signal when said oscillator is mistuned, and means responsive to said control signal for applying said auxiliary signal to said device to vary the reactance value of said device at random to select and set the reactance value of said device to produce the correct tuning for said oscillator and to thereafter remove said auxiliary signal from said device.

4. An automatic error correcting circuit for an oscillator having frequency determining elements to determine the tuning of the oscillator, comprising in combination, reactance means having a reactance value which may be set to any reactance value within a range of values connected with said frequency determining elements to control the tuning of said oscillator, means responsive to mistuning of said oscillator for randomly varying the reactance value of said device within said range of values to select and set said reactance means to a reactance value producing the correct oscillator tuning.

5. An automatic error correcting circuit for an oscillator having frequency determining elements to determine the tuning of the oscillator, comprising in combination, a ferromagnetic reactance means having a permeability value which may be set to any value within a range of values connected with said frequency determining elements to control the tuning of said oscillator, and means responsive to a mistuning of said oscillator for randomly varying the permeability of said ferromagnetic reactance means to select and set said ferromagnetic reactance means to a permeability value producing the correct oscillator tuning.

6. An error correcting circuit for an oscillator having frequency determining elements to determine the tuning thereof, comprising in combination, a ferromagnetic reactance device having a permeability value which may be set to any value within a range of values and having an output winding and a control winding thereon, means for connecting said output winding with said frequency determing elements to control the tuning of said oscillator, means providing a source of auxiliary signal, a gate circuit, means for connecting said source of auxiliary signal to the control winding of said ferromagnetic reactance device through said gate circuit, an error detecting circuit responsive to the tuning of said oscillator and for providing a control signal when said ocillator is mistuned, and means for applying said control signal to said gate circuit to control the conduction thereof for applying said auxiliary signal to said control winding for randomly varying the permeability of said device to select and set said permeability to a value to produce the correct oscillator tuning.

7. An error correcting circuit for an oscillator having frequency determining elements to determine the tuning thereof, comprising in combination, a ferromagnetic device capable of having the permeability thereof set to any value within a range of values and having an output winding and a control winding thereon, means for connecting said output winding with said frequency determining elements to control the tunning of said oscillator, a source of auxiliary signal, a gate circuit, means for connecting said source of amplitude modulated signal to the control winding of said ferromagnetic device through said gate circuit, an error detecting circuit connected to receive a signal indicative of the tuning of said oscillator and to provide a control signal in response thereto, and means for applying said control signal to said gate circuit to control the conduction thereof for applying said auxiliary signal to said control winding when said oscillator is mistuned for randomly varying the permeability of said device to select and set said permeability to a value to produce the correct oscillator tuning.

8. An error correcting circuit for an oscillator having frequency determining elements, comprising in combination, a ferromagnetic device having an output winding and a control winding thereon, means for connecting said output winding with said frequency determining elements to control the tuning of said oscillator, a source of auxiliary signal, an error detecting circuit connected to said oscillator providing a control signal when said oscillator is mistuned, and means responsive to said control signal for applying said auxiliary signal to said control winding to randomly select and set said ferromagnetic device to produce the correct oscillator tuning.

9. An error correcting circuit for an oscillator having tuning elements, comprising in combination, a parallel resonant circuit including a reactance device having a reactance value which may be set to any value within a range of values and connected in parallel with a capacitor element; means providing an alternating voltage connected across said parallel resonant circuit; error detecting means responsive to said oscillator frequency for providing a control signal when said oscillator is mistuned; means responsive to said control signal for varying the reactance value of said device at random to randomly vary the voltage across said parallel resonant circuit; and means connected to said tuning elements and responsive to the voltage across said parallel resonant circuit for controlling the tuning of said oscillator.

10. An error correcting circuit for an oscillator having tuning elements, comprising in combination, a ferromagnetic reactance device having an output winding and a control winding and having a reactance value at said output winding which may be set to any value within a range of values by a signal applied to said control winding; means for connecting said output winding to said tuning elements to control the tuning of said oscillator; error detecting means responsive to the frequency of said oscillator for providing a control signal when said oscillator is mistuned; means providing a source of periodically recurrent pulse signals; a storage capacitor connected to said error detecting means to be charged by said control signal during the interval between said pulse signals; a gate circuit having an open and a closed state and normally being in the open state; means for serially connecting said gate circuit, said storage capacitor, and said control winding; and means for applying said pulse signals to said gate circuit to change its condition to the closed state to develop a ringing signal across said control winding for randomly varying the reactance value of said device to select and set the correct tuning for said oscillator.

11. An error correcting circuit for an oscillator having tuning elements, comprising in combination, a ferromagnetic reactance device having an output winding and a control winding and having a reactance value which may be set to any value within a range of values, means for connecting said output winding to said tuning elements to control the tuning of said oscillator, error detecting means responsive to the frequency of said oscillator for providing a control signal when said oscillator is mistuned, means providing a source of periodically recurrent pulse signals, a gate circuit having an open and a closed state and normally being in the open state, a source of auxiliary signal, means for connecting said source of auxiliary signal through said gate circuit to said control winding, and means for applying said pulse signals to said gate circuit to change its condition to the closed state to apply said source of auxiliary signal to said control winding for randomly varying the reactance value of said device to select and set the correct tuning for said oscillator.

12. An error correcting circuit for an oscillator having tuning elements, comprising in combination, a reactance device having a reactance value which may be set to any value within a range of values connected to control the tuning of said oscillator, means providing a source of periodically recurrent pulse signals, and means responsive to a mistuning of said oscillator and to said pulse signals for randomly varying the reactance value of said device to select and set the correct tuning for said oscillator.

References Cited in the file of this patent

UNITED STATES PATENTS 2,811,642 Gabor ---------------- Oct. 29, 1957
2,897,352 Smith-Vaniz ---------- July 28, 1959